United States Patent
Ramanathan et al.

(10) Patent No.: US 7,183,648 B2
(45) Date of Patent: Feb. 27, 2007

(54) METHOD AND APPARATUS FOR LOW TEMPERATURE COPPER TO COPPER BONDING

(75) Inventors: Shriram Ramanathan, Hillsboro, OR (US); Sarah E. Kim, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 303 days.

(21) Appl. No.: 10/861,030

(22) Filed: Jun. 4, 2004

(65) Prior Publication Data
US 2005/0003664 A1    Jan. 6, 2005

Related U.S. Application Data

(60) Division of application No. 10/746,582, filed on Dec. 24, 2003, now abandoned, which is a continuation-in-part of application No. 10/610,743, filed on Jul. 2, 2003.

(51) Int. Cl.
*H01L 23/48* (2006.01)
*H01L 23/52* (2006.01)
*H01L 29/40* (2006.01)
*B23K 31/00* (2006.01)

(52) U.S. Cl. ............ 257/738; 257/777; 257/737; 257/E23.021; 257/E23.069; 257/E21.508; 228/180.22

(58) Field of Classification Search .............. None
See application file for complete search history.

(56) References Cited

U.S. PATENT DOCUMENTS

| | | | |
|---|---|---|---|
| 6,127,253 A | 10/2000 | Roldan et al. | |
| 6,177,729 B1* | 1/2001 | Benenati et al. | 257/738 |
| 6,495,397 B2 | 12/2002 | Kubota et al. | |
| 2002/0070463 A1* | 6/2002 | Chang et al. | 257/780 |
| 2003/0063452 A1 | 4/2003 | Satonaka | |

* cited by examiner

*Primary Examiner*—Jasmine Clark
(74) *Attorney, Agent, or Firm*—Cyndi Wheeler

(57) ABSTRACT

A method comprising: coating a conductive bump on a first substrate with a conductive material to form a coated conductive bump; coating a conductive bump on a second substrate with a conductive material to form a coated conductive bump; and bonding the coated conductive bump on the first substrate to the coated conductive bump on the second substrate to electrically connect the first substrate to the second substrate.

5 Claims, 7 Drawing Sheets

METHOD AND APPARATUS FOR LOW TEMPERATURE COPPER TO COPPER BONDING

CROSS REFERENCE TO RELATED APPLICATION

This is a Divisional Application of Ser. No. 10/746,582 filed Dec. 24, 2003 now abandoned, which is a Continuation-in-Part Application of Ser. No. 10/610,743 filed Jul. 2, 2003, which are presently pending.

BACKGROUND OF THE INVENTION

1. Field of the Invention

The present invention relates to the field of 3-dimensional stacked substrates and semiconductor packaging.

2. Discussion of Related Art

Three-dimensional stacked substrate (3D-SS) arrangements are electronic devices having a plurality of stacked semiconductor die/chips/wafers that are physically and electrically interconnected with one another. The drive toward achieving 3D-SSs is in its infancy, and numerous technical problems for achieving 3D-SSs have not yet been satisfactorily resolved.

Techniques similar to those used for a 3D-SS may also be used in physically and electrically connecting a die or 3D stack of die to a package substrate.

With each generation, as devices operate at lower voltages and higher frequencies, current levels at the die—die and/or at the die-package interface are increasing. This may cause EM (electromigration) failure for a 3D-SS at the die—die interface, or may cause EM failure at the die-package interface.

DETAILED DESCRIPTION OF THE PRESENT INVENTION

Figure 1:
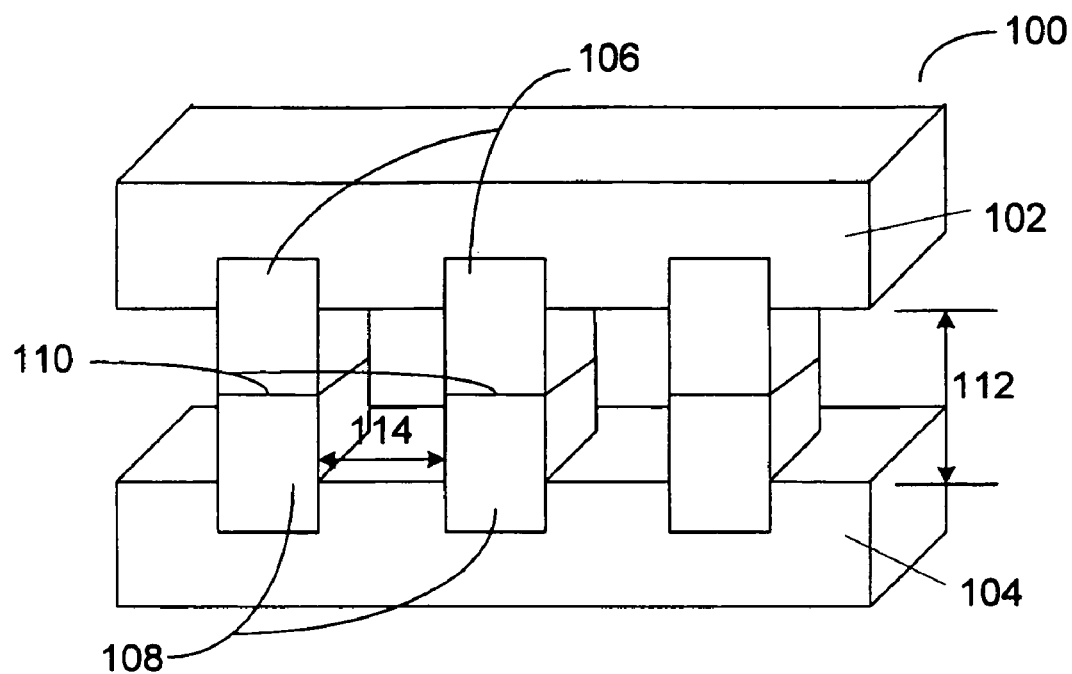
FIG. 1 is an illustration of a three-dimensional cross-sectional view of a 3D-IC interconnect structure.

In the following description, numerous specific details are set forth, such as exact process steps, in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention. When appropriate, like reference numerals and characters may be used to designate identical, corresponding or similar components in differing figure drawings. Further, in the detailed description to follow, example sizes/values/ranges/materials may be given, although the present invention is not limited to the same. As manufacturing techniques (e.g., photolithography) mature over time, it is expected that devices, apparatus, etc., of smaller size than those discussed could be manufactured.

Copper to copper bonding is considered to be one of the potential candidates in the fabrication of 3D SSs. Copper to copper bonding is also a candidate for fabrication of die to package interconnect structures. However, copper has a tendency to develop oxide and other contaminants during manufacturing processes. Copper also has a tendency to diffuse very fast through both silicon and interlayer dielectrics thereby leading to serious reliability concerns due to induced short circuits or high leakage currents. Electromigration is also a problem for copper structures without passivation. This disclosure sets forth a method and apparatus which may minimize the problems related to reliability concerns arising from excessive copper diffusion, electromigration and/or corrosion problems related to bonded structures, from a substrate (e.g., die, wafer, package) bonding perspective.

In practice, many different types of substrate stacks may be manufactured using copper interconnects. For example, if the stacked substrates are die, then it can be said that a three-dimensional die (3D-D), is formed. An alternative term may be a three-dimensional integrated circuit (3D IC). Individual semiconductor wafers may also be stacked/bonded to form a three-dimensional wafer stack (3D WS), or die could be bonded to wafers. Additionally, individual die or 3D-ICs may be bonded to a package substrate.

FIG. 1 illustrates an example three-dimensional cross-sectional view 100 of a small portion of a 3D-IC bonded using copper interconnect structures according to an embodiment of the present invention. Only a very small portion of the 3D-IC is shown for the sake of simplicity and brevity. A first IC substrate 102 and a second IC substrate 104 are bonded together to form a 3D-IC. The inter-substrate spacing 112 may be in the range of 0.01–0.20•m. Although not illustrated, the substrates 102, 104 may have predetermined integrated circuits, such as transistors or capacitors, formed thereon. While a 3D stack of only two IC substrates is shown for simplicity, the present invention is by no means limited to a two-substrate stack; a greater number of stacked/interconnected IC substrates may be accomplished with embodiments of the present invention, including stacks of three or more IC substrates.

The first IC substrate 102 has a plurality of interconnection pillars 106, and the second IC substrate 104 has a plurality of opposing interconnection pillars 108. The opposing interconnection pillars are joined at bonds or interfaces 110. The inter-pillar spacing 114 may range from 1 to 50•m, or more particularly may be between 3–5•m. The interconnection pillars may be formed, for example, by first forming copper plugs within etched vias in a surface of each IC substrate, then chemically-mechanically polishing (CMP) the plugs/surface in an attempt to achieve plug surfaces in a common plane (planarization), and then performing a selective removal (e.g. selective etching) process to result in slight surface elimination of only substrate material to achieve raised copper pillars.

The first and second IC substrates 102, 104 may then be precisely aligned, aligning opposing pillars, and bonded together, typically at elevated temperatures and/or under pressure, to form individual electrical and mechanical interconnections between each interconnection pillar pair 106, 108. While only a few interconnection pillar pairs 106, 108 are shown for simplicity, the actual practice of 3D-IC bonding may involve as few as tens or as much as ten of millions of interconnection pillar pairs.

The interconnection pillars 106, 108 may both be copper (Cu) pillar interconnections. The pillars may be other materials as well, such as aluminum (Al), gold (Au), silver (Ag), or alloys of two or more elements. While embodiments of the interconnection pillars 106, 108 are described as being made of a mutually common material such as copper, practice of embodiments of the present invention is not limited thereto. The interconnection pillars 106, 108 may be made of mutually differing materials, for example, one pillar may be gold while the other is copper, so long as the two materials may physically bond together to form an electrical conduction path.

The bonded interconnection pillars provide a rigid and permanent physical bonding of the opposing IC substrates 102, 104 together, while individual bonded interconnection pillars may each provide an electrical conduction path to electrically interconnect portions of circuits on the opposing substrates 102, 104.

Figure 2:
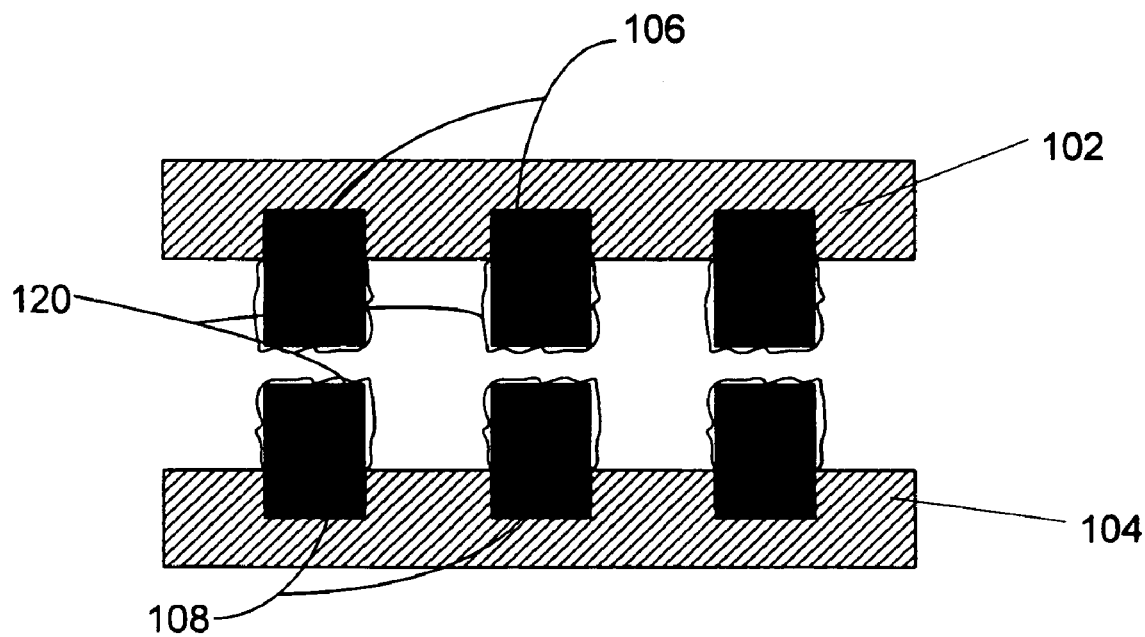
FIGS. 2–4 are cross-sections illustrative of a disadvantageous situation that may negatively affect manufacturability and/or reliability of 3D-ICs.
Figure 3:
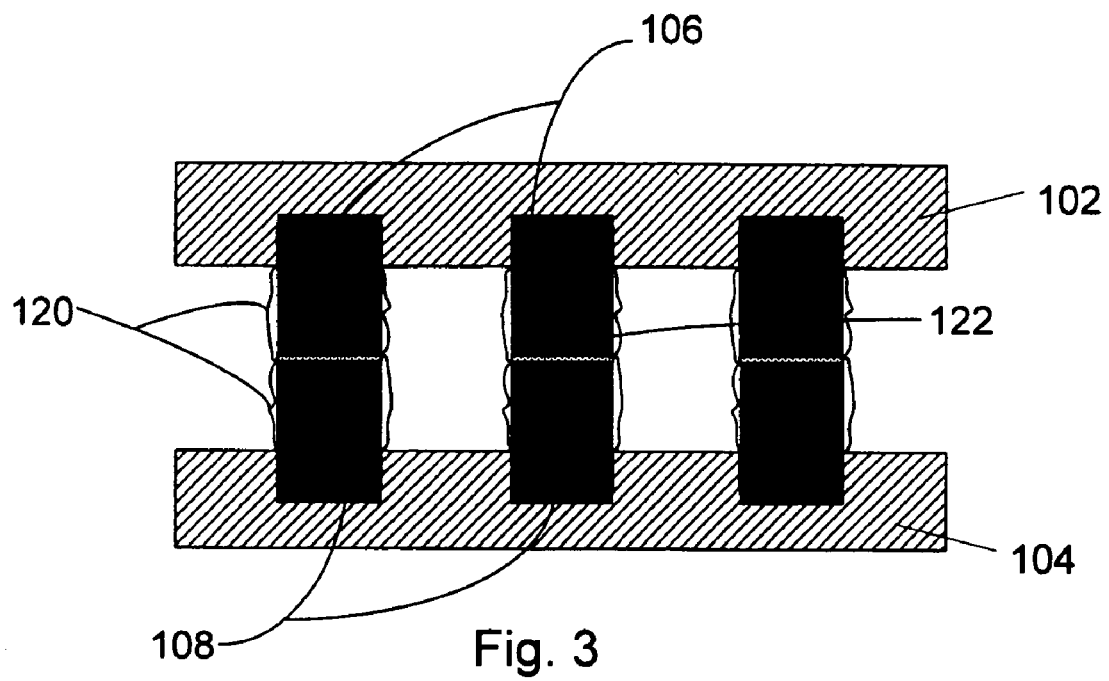

For 3D-ICs to gain widespread acceptance in the industry, they must offer both a reasonable level of manufacturability and a high level of reliability. FIGS. 2 and 3 are illustrative of a disadvantageous situation that may negatively affect manufacturability and/or reliability. Contaminants may negatively interfere with, and thus affect the integrity of, physical bonding of the opposing substrates 102, 104 together, and/or may negatively affect an integrity or quality of electrical conduction paths of the individual bonded interconnection pillars.

FIG. 2 is a cross-sectional view of opposing substrates 102 and 104 prior to bonding, illustrating undesirable contaminants 120 formed on the exposed surfaces of opposing pillars 106 and 108. The contaminants may be formed during a manufacturing process such as chemical mechanical polishing (CMP). CMP or other fabrication processes may leave a native oxide on top of the copper surface, and also may leave organic contaminants on the surfaces of the pillars. The presence of such contaminants 120 may increase the temperature required for a subsequent successful bond.

FIG. 3 shows the opposing substrates 102, 104 of FIG. 2 after opposing pillars 106, 108 have been bonded together. Contaminants 120 disposed on opposing bonding surfaces of the pillars may lead to disadvantageous bonds, 122. Contaminants 120 may prevent physical bonding, or may result in a weakened physical bond 122. Moreover, the presence of an oxide film on the bond surface of the pillar may also prevent grain growth across the bonded interfaces, which could lead to a lower bond strength and/or void formation.

The bond 122 containing contaminants 120 may potentially result in or represent a total disruption in an electrical conduction path intended along a bonded pillar pair. For example, the oxide/contaminants may act as an interrupting or blocking electrical insulator barrier. Alternately, the bond may conduct electricity, but the resulting electrical conduction path may be undesirable. The contaminants 120 may increase the total resistance of the electrical interconnections created by bonding pillars due to the presence of a poor conductor, such as an oxide, at the bond interfaces 122.

An undesirable pillar bond may have devastating effects on the manufacturability and reliability of the 3D-IC. Proper formation and operation of the bond/path of each pillar pair between opposing 3D-IC substrates may each be critical to an ultimate successful electrical operation of the 3D-IC, and any failure of any bond/path at the time of manufacturing or at a subsequent time may render the 3D-IC unusable/inoperable. Accordingly, it is highly desirable that failures be avoided, so as to increase yield and reliability.

High temperature bonding offers one solution to the contaminant problem illustrated in FIGS. 2 and 3. A high temperature applied during a bonding process tends to remove or de-oxidize the contaminants and/or melt opposing pillar pair material (e.g., copper) together. However, high temperature bonding has itself been found to cause additional problems. For example, copper has very high diffusivity, even at room temperature. At elevated temperatures, the diffusivity of copper is even greater. Thus, if high temperature bonding is performed, copper pillar material may diffuse onto and/or into the substrate.

Figure 4:
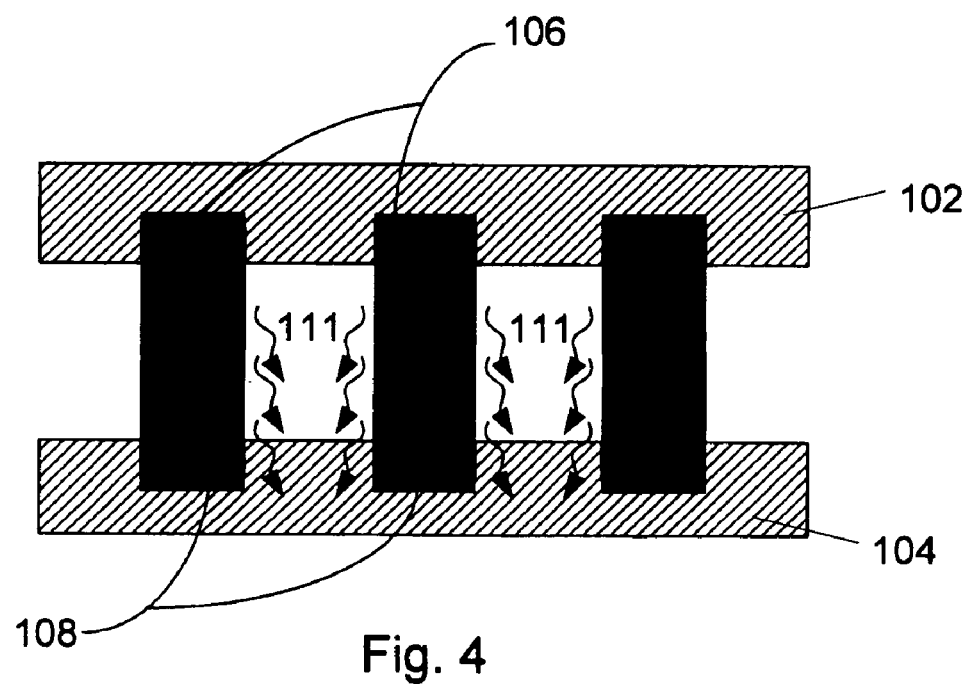

FIG. 4 illustrates the diffusion of copper pillar material 111 onto or into the substrate 108. Diffusion may cause leaky conduction paths, may effectively decrease the electrical spacing between neighboring pillars, and may result in catastrophic short-circuiting and/or electrical discharges, which may cause the IC to stop functioning. Furthermore, copper may diffuse into the dielectric portions of the substrate, which may increase leakage currents; or copper may diffuse into the active Si components in the substrate, which could potentially render them inoperable. Because high temperatures typically exacerbate diffusion, high temperature bonding should be avoided as much as possible during manufacturing. Additionally, temperatures higher than 400–500° C. could lead to the destruction of the circuit components formed within the IC substrate.

Thus, it is desirable to perform metal bonding of 3D-ICs at relatively low temperatures in order to avoid reliability concerns. Clean copper surfaces may enable low temperature bonding and result in lower interfacial resistances. One embodiment of the present invention details preparation of clean copper pillar surfaces to enable bonding at low temperatures. Low temperature bonding may be defined in a number of ways. For copper pillars, low temperature bonding may be defined as bonding effected at less than 250° C., or alternately, at less than 200° C., or still further, at less than 150° C. If different pillar material other than copper is used, then a different low temperature may be applicable. As an alternative definition, a low temperature may be any temperature enabling less than or not more than a predetermined rate of diffusion of the pillar material during the bonding operation, for example, enabling less than or not more than a predetermined rate of X atoms/m$^2$s, where X is a predetermined number, m is meters and s is seconds. Low temperature may also be defined in terms of ratio of bond temperature to melting point. Using copper as an example, copper's bond temperature to melting point is a ratio of approximately 473K/1357K=0.34. Accordingly, pillar materials useable with embodiments of the present invention may have a ratio of bond temperature to melting point of <0.40, or more particularly <0.35. A lower ratio means that the material will bond at a low temperature in comparison to the melting point; lower temperatures generally mean lower diffusion rates in comparison to a melting point diffusion rate where the material transforms from solid to liquid.

To prepare clean copper surfaces to enable bonding at low temperature, the copper surface may be cleaned by etching, chemical reaction and/or heating prior to bonding to obtain low interfacial resistance. The following examples detail processes used to prepare clean copper surfaces to enable low temperature bonding.

Figure 5:
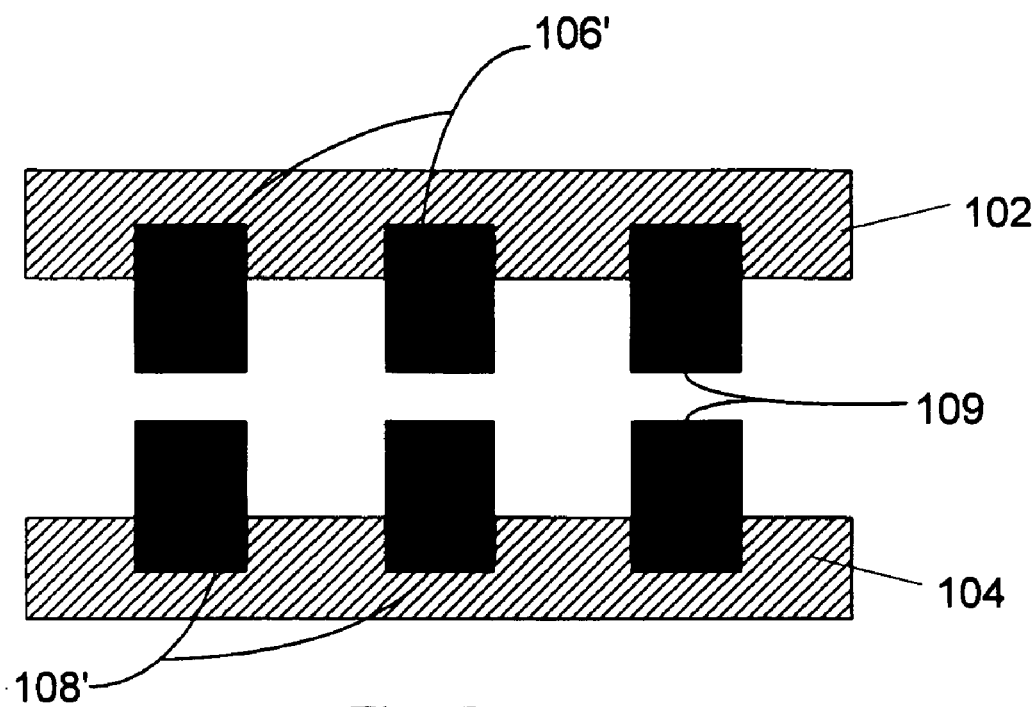
FIGS. 5–6 are cross-sections illustrative of an embodiment which may enhance manufacturability and/or reliability of 3D-ICs.

Example Process Flow A (Chemical Cleaning):

Operation 1: The copper pillars 106, 108 of die or wafers to be bonded together as a 3D-IC may be exposed to a mixture of 1:1 H2O:HCl for about 1 minute at room temperature. Practice of the present invention is not limited thereto, and instead, other types of chemicals, mixtures and/or times may be used for cleaning, and especially if a pillar material other than copper is used. Following this operation, the wafers are rinsed in distilled (DI) water and then dried. This operation may result in clean copper pillars 106', 108' with pillar surfaces, including bonding surface 109, having no native oxide or other contaminants thereon, as illustrated in FIG. 5.

Operation 2: The cleaned die or wafers are loaded into an aligner tool and precisely aligned so as to align opposing pillars for bonding.

Operation 3: Immediately, or within a predetermined amount of time after the cleaning operation, the aligned die or wafers are then bonded using a bonder tool at low temperatures (e.g., <200° C.) resulting in clean copper—copper bonds or interfaces 110 illustrated in FIG. 6. Inter-substrate voids 170 are formed as framed by combinations of the IC substrates 102, 104 and neighboring interconnection pillar pairs 106' and 108'.

Example Process Flow B (Heat/Vapor Cleaning Prior to Bonding):

Operation 1: The copper pillars 106, 108 of die or wafers to be bonded together as a 3D-IC may be heated in a processing chamber to a temperature between 200–350° C. in an inert or reducing atmosphere or in high vacuum ($<10^{-6}$ Torr).

Operation 2: The die or wafers may then be exposed to methanol vapor leaked in at low pressure of approximately $10^{-5}$ Torr for a short time of approximately 5–15 minutes. Methanol chemically reacts with $Cu_2O$ to form gaseous products such as $CO_2$, $CH_2O$ and $CO$. This treatment may remove any native oxide present on the copper surface and other contaminants. Practice of the present invention is not limited to the temperatures, vapor, pressures and/or times given, and instead, other temperatures, vapor, pressures and/or times may be used for cleaning, and especially if a pillar material other than copper is used.

Operation 3: The die or wafers are then cleaned in acetone and ethanol to remove any organic contaminants, which results in a clean surface ready to be bonded at a low temperature. Such operation results in clean copper pillars 106', 108' with surfaces, including bonding surfaces 109 containing no native oxide, as illustrated in FIG. 5.

Operation 4: The two die or wafers to be bonded are precisely aligned using an aligner tool.

Figure 6:
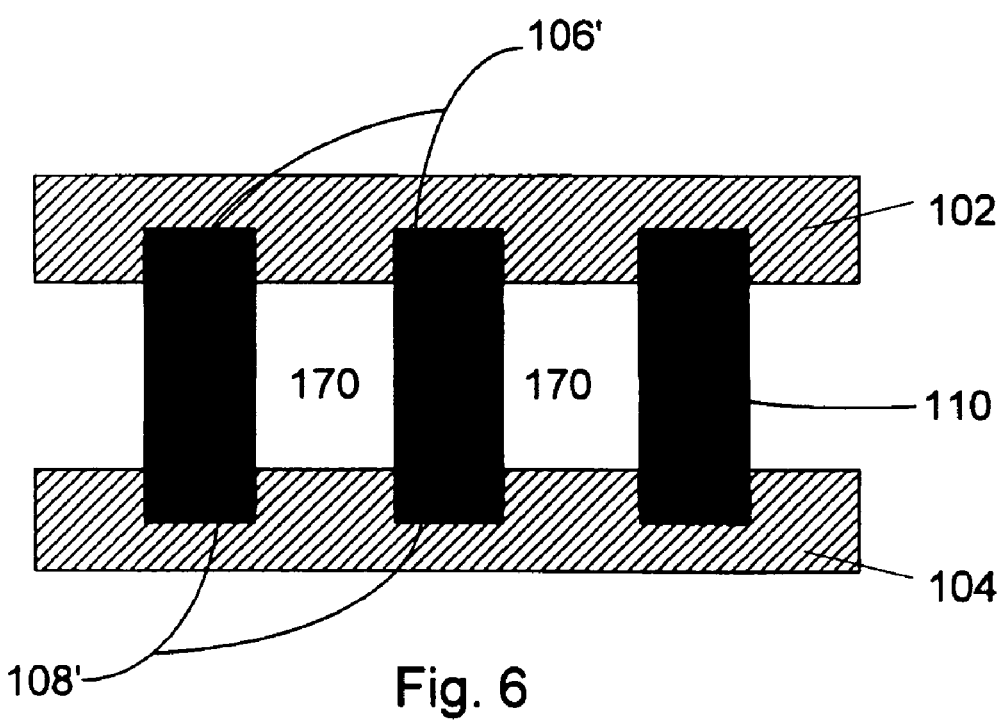

Operation 5: Immediately, or within a predetermined amount of time, after the cleaning operation, the aligned wafers are bonded using a commercial bonder tool at low temperatures (e.g., <200° C.) resulting in clean copper—copper bonds or interfaces 110, as illustrated in FIG. 6. Again, inter-substrate voids 170 are formed as framed by combinations of the IC substrates 102, 104 and neighboring interconnection pillar pairs 106', 108'. Voids 170 are advantageous because they are substantially free of contaminants.

By providing a clean metal pillar surface, it may be possible to perform the bonding process at low temperatures (<250° C., <200° C., or <150° C.), which may reduce the manufacturing thermal budget significantly and which may also minimize undesirable copper diffusion during the bonding process. Advantages of embodiments of the present invention include: (1) copper—copper bonding at low temperatures, (2) lower interfacial resistance due to a clean metal—metal interface, (3) increased bond strength due to a clean metal—metal interface, and (4) a lower manufacturing thermal budget.

Figure 7:
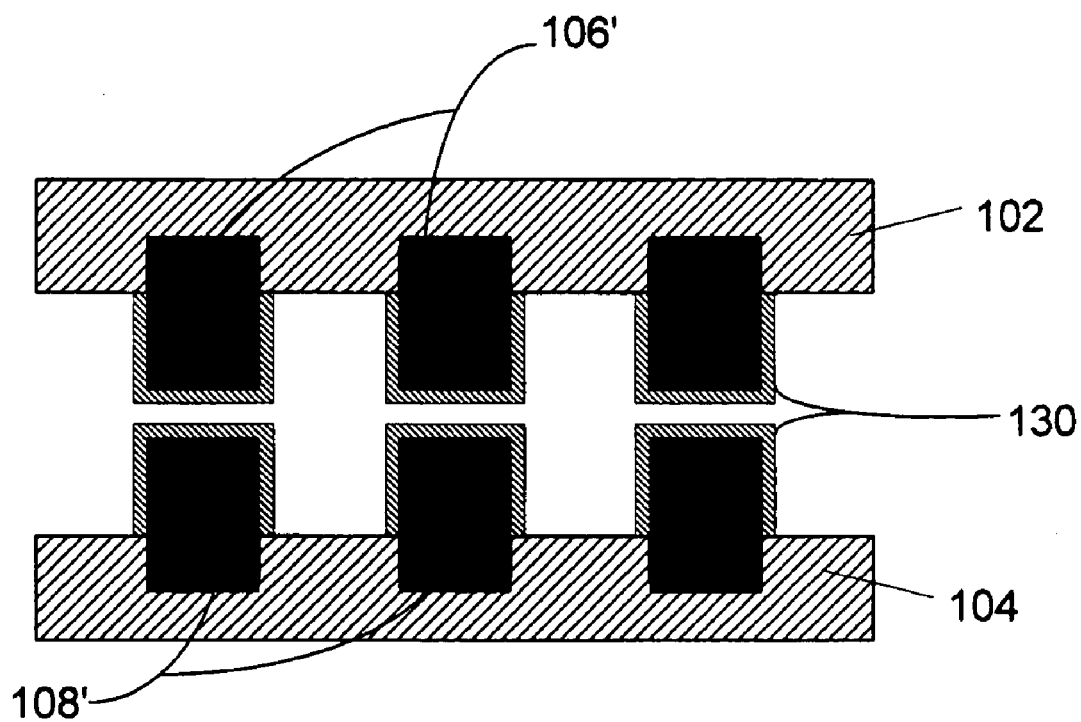
FIGS. 7–8 are cross-sections illustrative of an embodiment which may enhance manufacturability and/or reliability of 3D-ICs.

FIG. 7 illustrates a partial cut-away of substrates 102 and 104, and pillars 106' and 108'. A thin pre-bonding layer 130 may be formed on all clean exposed surfaces of the pillars 106', 108'. This thin layer may prevent or minimize the diffusion of copper from the pillar during and after bonding. Because copper has such a high diffusivity, copper pillar material may diffuse onto and/or into the substrate even at room temperatures, if a diffusion barrier such as thin layer 130, is not used. The thin layer may also help to avoid or minimize electromigration of pillar material. The thin layer also helps to prevent any corrosion of exposed pillar material. In one embodiment, the thin layer 130 may be a metal film having a thickness of less than 10•m or less than 10 Å. More particularly, the passivation material may be formed at a thickness within a range of 0.01–0.03•m.

The thin layer may be selectively deposited on the surfaces of copper pillars 106' and 108' to serve as a diffusion barrier for the copper. Self-assembly of a conductive coating on the copper surface is one option that may be used to form the thin layer, e.g., using a material which selectively deposits only on copper. Upon bonding, the coating spreads on the copper sidewall and protects it from any corrosion or electromigration. Potential metals that may be used to form the thin layer include, Ta, Ti, Mg, Al, but practice of the present invention is not limited to such example metals. In another embodiment, a noble metal, such as silver or gold, may be used to form the thin layer. The choice of an appropriate thin layer material for any given implementation may depend upon the choice of pillar material.

The thin pre-bonding layer 130 may alternately be formed by the deposition of a few monolayers of a metal thin film by atomic layer deposition (ALD) selectively on the copper. Any known ALD process may be used. Atomic layer deposition has excellent step coverage and can fill trenches effectively since the growth mechanism is a layer-by-layer mode.

Figure 8:
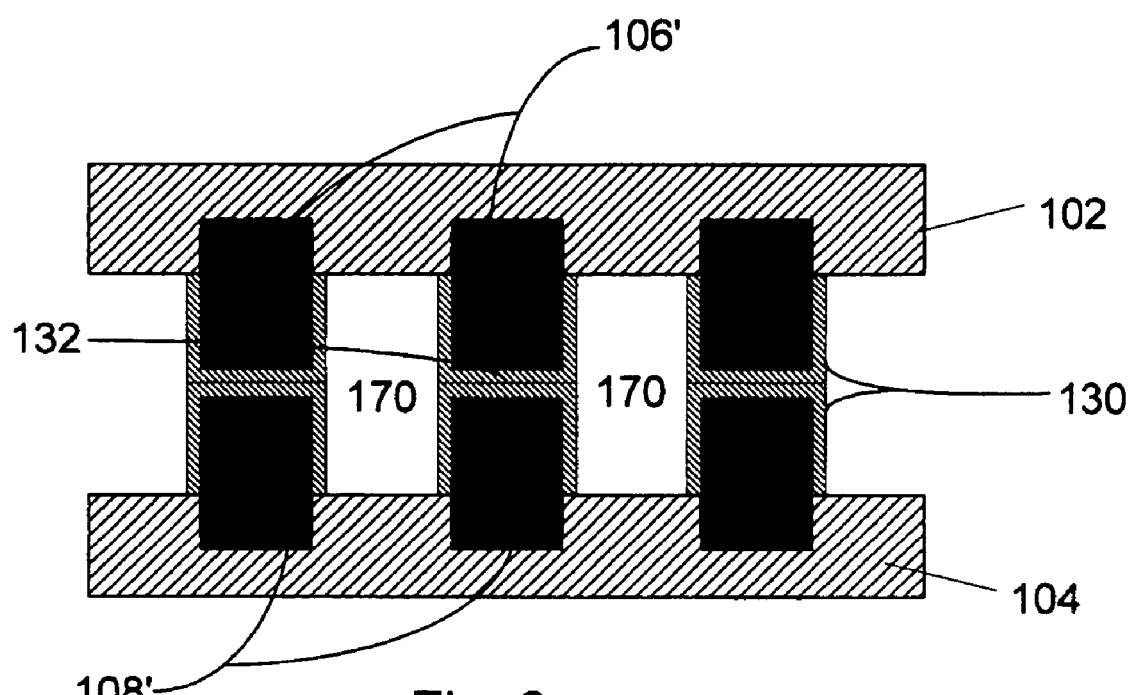

FIG. 8 illustrates the substrates 102, 104 and pillars 106', 108' after having been subjected to a bonding operation. In one embodiment, portions of the thin layers 130 may remain sandwiched between each pillar pair 106',108', and may participate in the bond 132. In such case, care should be taken to ensure that a material of the thin layers 130 will help provide a sufficient bond responsive to the subject bonding operation of record (BOOR). That is, a sufficient bond 132 should be established not only between the opposing thin layers 130, but a sufficient bond should be established or maintained between each thin layer 130 and the pillar material (e.g., Cu). Bonding with the thin layers 130 should also accommodate pillar deformation and/or creep. The thin layer material should be selected to provide stable, long-term protection throughout the anticipated life of the 3D IC.

In another embodiment, the methods and materials described above may be used to enable low temperature bonding between a single die or 3D stack of die having copper C4 bumps and a package having copper solder bumps. Although the terms "C4 bump" and "solder bump" are typically used to describe structures comprised of an alloy of metals such as lead and tin, these terms are being used herein to describe structures having the same function as a typical C4 bump or solder bump, but comprised of a single homogenous metal, such as copper, or alloys of other metals.

Figure 9:
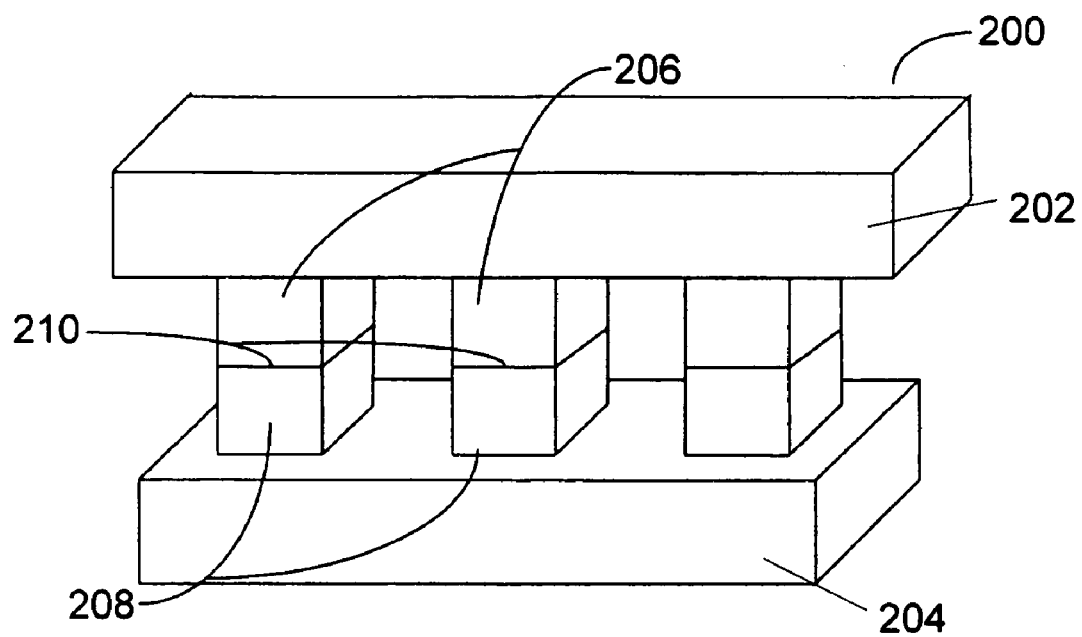
FIG. 9 is an illustration of a three-dimensional cross-sectional view of a die-package interconnect structure.

FIG. 9 illustrates an example three-dimensional cross-sectional view 200 of a small portion of a die 204 bonded to a package substrate 202 according to an embodiment of the present invention. The package substrate 202 may be a printed circuit board (PCB). The package substrate 202 has a plurality of solder bumps 206, which may be comprised of copper or another conductive material, such as aluminum, gold, silver, or alloys of two or more elements. The die 204 has a plurality of C4 bumps 208, which may be comprised of copper or another conductive material, such as aluminum, gold, silver, or alloys of two or more elements. The solder bumps 206 and C4 bumps 208 are shown as squares for the purposes of illustration only, and may be spherical in shape. The solder bumps and C4 bumps are typically much wider than the pillars described above, and may be as large as 70–100 microns wide, or smaller.

The solder bumps 206 on the package are bonded to the opposing C4 bumps 208 on the die to form electrical interconnections between the die and the package. While embodiments describe the C4 bumps and the solder bumps as being made of a mutually common material such as copper, embodiments of the invention is not limited thereto. The C4 bumps and solder bumps may be made of mutually differing materials, so long as the two materials may physically bond together to form an electrical conduction path.

As described above with respect to copper pillars, the copper surfaces of the C4 bumps and the solder bumps may be cleaned prior to bonding to enable bonding to occur at low temperatures. The copper C4 bumps and the copper solder bumps may be cleaned using an acid etch or chemical cleaning, as describe in example process flow A, above. Alternately, the copper C4 bumps and copper solder bumps may be cleaned using heat/vapor cleaning, as described in example process flow B, above. The copper C4 bumps and copper solder bumps may also be cleaned by performing a gas anneal to remove any native oxide.

Figure 10:
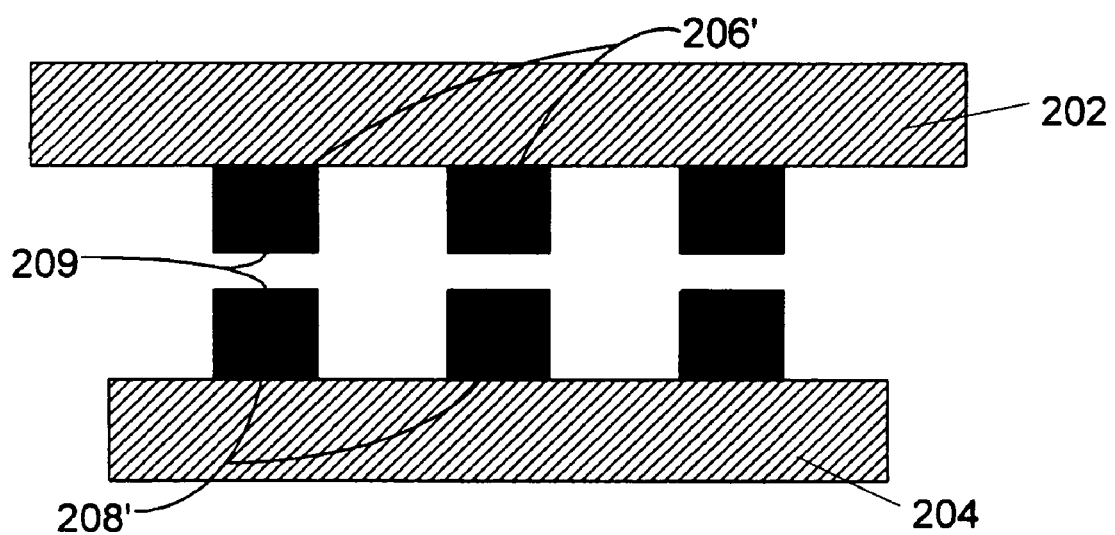
FIGS. 10–12 are cross-sections illustrative of embodiments which may enhance manufacturability and/or reliability of die-package interconnect structures.

FIG. 10 illustrates a cross-section of package substrate 202 and die 204 after the copper solder bumps 206' and copper C4 bumps 208' have been cleaned to remove any contaminants that may have been present on the copper surfaces. The cleaning operation results in copper solder bumps 206' and copper C4 bumps 208' having clean surfaces, including clean bonding surfaces 209.

Figure 11:
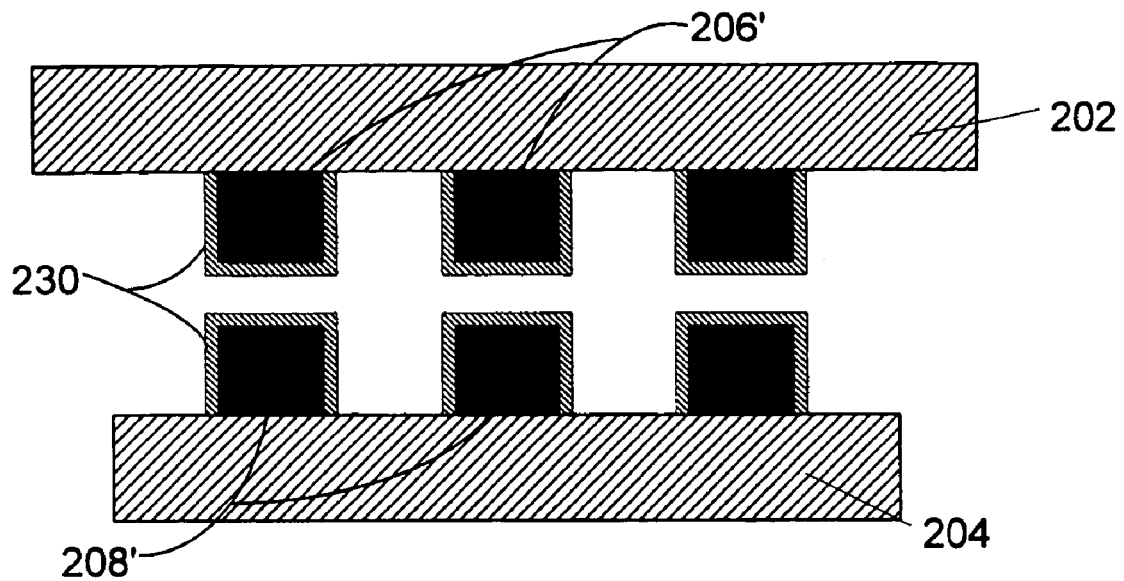

Next, as illustrated in FIG. 11, a thin layer of metal 230 may be formed selectively on the clean copper solder bumps 206' and the clean copper C4 bumps 208'. This thin layer may prevent or minimize diffusion of copper from the solder bumps and C4 bumps during and after bonding. The thin layer may also help to avoid or minimize electromigration of copper solder bump and copper C4 bump material, as described above. In one embodiment, the thin layer is comprised of a noble metal, such as silver. Other noble metals, including gold, platinum, palladium, osmium, iridium, ruthenium, or rhodium, may potentially be used to form the thin layer as well.

The use of a thin layer material which has a low solubility in the bump material is desirable to enhance resistance to electromigration and to prevent voiding in the solder bumps and C4 bumps. A low solubility is defined as less than 1% solubility at 400° C. Silver, a noble metal, has low solubility in copper (less than 0.5% at 400° C.), and thus the thin layer of silver used to coat the copper surfaces may enhance resistance to electromigration and may prevent voiding in the copper solder bumps and the copper C4 bumps. The thin layer may also reduce or prevent corrosion of the copper solder bumps and copper C4 bumps.

The thin layer 230 of silver may be deposited selectively on the clean copper solder bumps 206' and on the copper C4 bumps 208' using displacement deposition. By depositing the thin layer in this manner, the silver may be deposited only on the copper surfaces and not on the surface of the substrate. Alternately, the thin layer may be deposited over both the copper surfaces and the exposed surfaces of the die or package substrate by sputtering, electro-beam evaporation from a silver target, chemical vapor deposition, or atomic layer deposition (ALD). If the thin layer is deposited over the entire surface using one of these deposition techniques, the process may be followed by a masking operation to mask the coated copper bumps, and an etch to remove the silver from the substrate surface, leaving the silver film only on the surfaces of the copper bumps.

The thin layer 230 formed on the copper bumps may range in thickness from approximately 40 to 100 nm. More particularly, the thin layer may be approximately 50 nm thick.

After forming the thin layer of noble metal on both the copper solder bumps on the package substrate and on the copper C4 bumps on the die substrate, the die and package to be bonded may be precisely aligned using an aligner tool. The die and package may then be bonded together at low temperatures (e.g., <300° C.).

Figure 12:
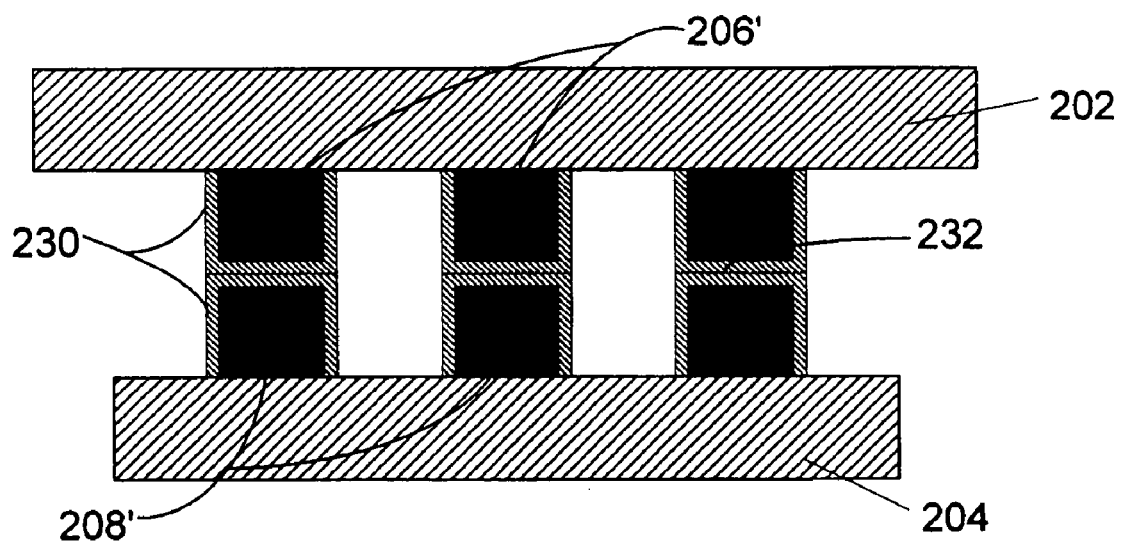

FIG. 12 illustrates the die 204 and package 202 substrates after the copper C4 bumps 208' have been bonded to opposing copper solder bumps 206'. In one embodiment, portions of the thin layers may remain sandwiched between each copper bump pair 206', 208', and may participate in the bond 232. The thin layer of noble metal 230 which coats the copper bumps 206' and 208' may decrease the diffusion of copper into the other substrate materials. The use of silver as the thin layer metal may also prevent out-diffusion and voiding of the copper, because silver has a very low solubility at room temperature and thus it is unlikely that the silver would diffuse into the copper to form a solid solution.

Figure 13:
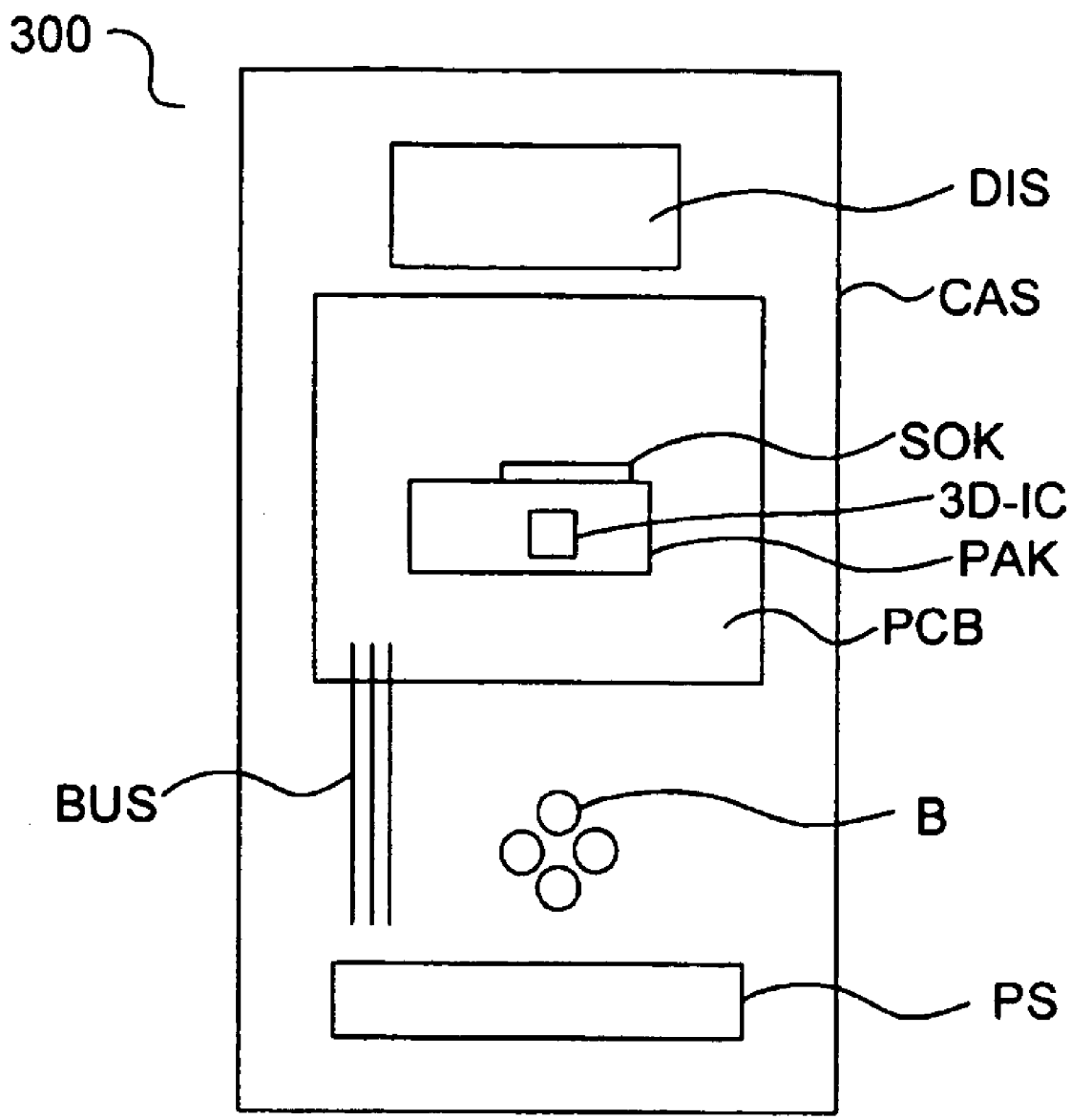
FIG. 13 is an illustration of a system which may include embodiments of the present invention.

FIG. 13 illustrates an example electronic system arrangement that may incorporate implementations of the present invention. More particularly, at a low level, shown is a 3D-IC that may incorporate one or more implementations of the present invention as a 3D-IC system. The 3D-IC may be further mounted as part of an electronic package PAK system incorporating the 3D-IC together with supporting components (e.g., a voltage regulator, decoupling capacitors, etc.) onto a substrate (such as a printed circuit board (PCB)). The PAK system may also incorporate one or more embodiments of the present invention in the die or 3D-IC to package bonds. The PAK system may be further mounted, for example, via a socket SOK onto a system printed circuit board PCB (e.g., a motherboard system). The system board may be part of an overall electronic device (e.g., computer, electronic consumer device, server, communication equipment) system 100 that may also include one or more of the following items: input (e.g., user) ports B, output ports (e.g., display DIS, audio system), other peripheral ports (e.g. printer, internet connections, etc.), a bus or bus portion BUS, a power supply arrangement PS, other integrated circuits and chipsets, and a case CAS (e.g., plastic or metal chassis).

Although example embodiments of the present invention have been described using example 3D-ICs and/or 3D WSs having two layers and using copper (Cu) pillar interconnections there-between, practice of the invention is not limited thereto. For example, the invention may be able to be practiced with more than two layers, with other types of substrates, with other (non-pillar) types of interconnections, and with other types of materials besides copper (e.g., aluminum (Al), gold (Au), silver (Ag)).

We claim:

1. A device comprising:
   two stacked substrates; and
   a plurality of copper bumps provided on each substrate, wherein each of the plurality of copper bumps is coated with a conductive material and opposing coated copper bumps are bonded to one another to electrically connect the two stacked substrates.

2. The device of claim 1, wherein the conductive material comprises a noble metal.

3. The device of claim 2, wherein the noble metal comprises silver.

4. The device of claim 3, wherein the two stacked substrates comprise a semiconductor die substrate and a package substrate.

5. The device of claim 3, wherein the two stacked substrates comprise semiconductor substrates.

* * * * *